United States Patent
Yang et al.

(10) Patent No.: US 9,903,906 B2
(45) Date of Patent: Feb. 27, 2018

(54) FLEXIBLE CIRCUIT BOARD AND CUTTING DEVICE

(71) Applicants: BOE TECHNOLOGY GROUP CO., LTD., Beijing (CN); BOE (HEBEI) MOBILE DISPLAY TECHNOLOGY CO., LTD., Gu'An, Hebei (CN)

(72) Inventors: Guowen Yang, Beijing (CN); Ze Zhang, Beijing (CN); Lantao Chen, Beijing (CN)

(73) Assignees: BOE TECHNOLOGY GROUP CO., LTD., Beijing (CN); BOE (HEBEI) MOBILE DISPLAY TECHNOLOGY CO., LTD., Hebei (CN)

( * ) Notice: Subject to any disclaimer, the term of this patent is extended or adjusted under 35 U.S.C. 154(b) by 127 days.

(21) Appl. No.: 15/184,595

(22) Filed: Jun. 16, 2016

(65) Prior Publication Data

US 2017/0082681 A1  Mar. 23, 2017

(30) Foreign Application Priority Data

Sep. 21, 2015 (CN) .......................... 2015 1 0604153

(51) Int. Cl.
*G01R 31/28* (2006.01)
*H05K 1/02* (2006.01)
(Continued)

(52) U.S. Cl.
CPC ......... *G01R 31/2818* (2013.01); *G09G 3/006* (2013.01); *H05K 1/0213* (2013.01);
(Continued)

(58) Field of Classification Search
CPC ............ G01R 31/2818; G01R 31/2805; G01R 19/257; G01R 31/2884; G01R 31/3004;
(Continued)

(56) References Cited

U.S. PATENT DOCUMENTS 4,593,804 A * 6/1986 Kinsey .................. G01R 1/073
193/41
5,152,054 A * 10/1992 Kasahara ............ H01L 21/4839
174/535

(Continued)

FOREIGN PATENT DOCUMENTS

CN 201776793 U 3/2011
CN 104869752 A 8/2015

OTHER PUBLICATIONS

The First Chinese Office Action dated Jun. 28, 2017; Appln. No. 201510604153.1.

*Primary Examiner* — Minh Phan
*Assistant Examiner* — Robert P Alejnikov, Jr.
(74) *Attorney, Agent, or Firm* — Ladas & Parry LLP

(57) ABSTRACT

A flexible circuit board and a cutting device are provided. The flexible circuit board includes a board body including a cutting region. A plurality rows of testing terminals are located in the cutting region, a first spacing being provided between two adjacent rows of testing terminals. The testing terminals can be respectively cut off from the board body along a cutting direction which is along the extending direction of the first spacing in the board body. A testing circuit is located on a surface of the board body. The testing circuit is arranged in a region outside the cutting region and the testing circuit is independently and electrically connected to each row of the testing terminals.

14 Claims, 3 Drawing Sheets

(51) Int. Cl.
*H05K 1/11* (2006.01)
*H05K 3/00* (2006.01)
*H05K 3/04* (2006.01)
*G09G 3/00* (2006.01)

(52) U.S. Cl.
CPC ............ *H05K 1/115* (2013.01); *H05K 3/0044* (2013.01); *H05K 3/04* (2013.01); *G01R 31/2805* (2013.01); *H05K 2201/05* (2013.01); *H05K 2203/0147* (2013.01); *H05K 2203/0228* (2013.01); *H05K 2203/16* (2013.01)

(58) Field of Classification Search
CPC .......... G01R 31/3181; G01R 31/31813; G09G 3/006; H05K 1/0213; H05K 1/115; H05K 3/0044; H05K 3/04; H05K 2201/05; H05K 2203/0147; H05K 2203/0228; H05K 2203/16; H05K 1/0277; H05K 1/0278; H05K 1/028; H05K 1/0281; H05K 1/0283; H05K 1/0393; H05K 1/118; H05K 1/147; H05K 1/148; H05K 1/189; H05K 2201/042; H05K 2201/046; H02B 1/056; H01L 24/50
USPC ........................ 324/750.3; 174/254; 361/627
See application file for complete search history.

(56) References Cited

U.S. PATENT DOCUMENTS

| | | |
|---|---|---|
| 2012/0002380 A1 | 1/2012 | Kato |
| 2014/0124240 A1* | 5/2014 | Cheng .................. H05K 1/0213 174/250 |
| 2016/0356840 A1 | 12/2016 | Wang et al. |

* cited by examiner

FLEXIBLE CIRCUIT BOARD AND CUTTING DEVICE

TECHNICAL FIELD

Embodiments of the present disclosure relate to a flexible circuit board and a cutting device.

BACKGROUND

In the manufacturing processes of liquid crystal display devices, there are various semi-finished products that are not bonded with flexible circuit boards, however, it needs to perform electric test on the semi-finished products. In the electric test of such semi-finished products that are not bonded with the flexible circuit board, it needs a flexible circuit board to perform the test.

SUMMARY

At least one embodiment of the present disclosure provides a flexible circuit board and a cutting device. The embodiment of the present disclosure provides the following technical solutions. A flexible circuit board includes a board body having a cutting region; a plurality rows of testing terminals located in the cutting region, a first spacing being provided between two adjacent rows of testing terminals. The testing terminals can be respectively cut off from the board body along a cutting direction which is along the extending direction of the first spacing in the board body. A testing circuit is located on a surface of the board body, the testing circuit being arranged in a region outside the cutting region and the testing circuit is independently and electrically connected to each row of testing terminals.

In an example, each of the testing terminals is in a shape of rectangle, and the cutting direction is parallel to the length direction of the testing terminal row.

In an example, the board body includes multiple lines of via holes, and each line of the via holes corresponds to each row of the testing terminals, and each line of the via holes includes two via holes respectively located at two sides of the testing terminal row, and the distance between two via holes 140 in each line is equal to each other.

In an example, the first spacing between each of two adjacent rows of testing terminals is equal to each other, and a second spacing between each of two adjacent lines of via holes is equal to each other; and the via holes in each line are offset from the corresponding testing terminals toward the testing circuit.

According to at least one embodiment, a cutting device for cutting the flexible circuit board is provided, comprising: a fixing component configured to fix the flexible circuit board and expose the first spacing and its extending region on the board body; and a cutter configured to cut the testing terminals from the flexible circuit board along the first spacing and its extending region on the board body.

In an example, each of the testing terminals is in a shape of rectangle, and the cutting direction is parallel to the length direction of the testing terminal row.

In an example, the board body includes multiple lines of via holes, and each line of the via holes corresponds to each row of the testing terminals, and each line of the via holes includes two via holes respectively located at two sides of the testing terminal row, and the distance between two via holes in each line is equal to each other.

In an example, the fixing component of the cutting device comprises a first fixing element and two locating pins disposed on an upper surface of the first fixing element, and a distance between the two locating pins is equal to the distance between two via holes in each line of the flexible circuit board, and the locating pins are configured to pass through the two via holes in each line of the flexible circuit board to fix the flexible circuit board.

In an example, the first spacing between each of two adjacent rows of the testing terminals of the flexible circuit board is equal to each other, and the second spacing between each of two adjacent lines of the via holes is equal to each other; the via holes in each line are offset from the corresponding testing terminals toward the testing circuit; based on a distance between each of the testing terminals and the testing circuit, the plurality rows of testing terminals are respectively a first row of testing terminals, a second row of testing terminals, . . . , a $n^{th}$ row of testing terminals from far to near, and the corresponding n lines of via holes are respectively a first line of via holes, a second line of via holes, . . . , a $n^{th}$ line of via holes; and an upper surface of the first fixing element of the cutting device includes a first edge along the cutting direction; if the $X^{th}$ testing terminal needs to be cut out, the $x^{th}$ line of via holes are fixed with the locating pins, and the first edge of the first fixing element is located at the first spacing between the $x^{th}$ testing terminal and the $X+1^{th}$ testing terminal; where n is a natural number being equal or larger than 2; and X is a natural number falling within a range of 1~n−1.

In an example, the fixing component further comprises a second fixing element; wherein the second fixing element has two locating holes in its lower surface; a distance between the two locating holes is equal to the distance between the two locating pins; the locating pins are configured to be inserted into the locating holes to allow the lower surface of the second fixing element being pressed against the upper surface of the first fixing element and the first edge of the first fixing element is aligned with a second edge of the second fixing element.

In an example, the first fixing element is configured with a first attracting element; the second fixing element is configured with a second attracting element which mutually attracts the first attracting element; the first attracting element and the second attracting element are fixed together through mutual attraction to allow the lower surface of the second fixing element is pressed against the upper surface of the first fixing element.

In an example, the first fixing element and the second fixing element each has a slide way; and the direction of the slide ways is parallel to the cutting direction; and the cutter has a cutting part and two slidable parts connected with the cutting part, and the slidable parts slip in the slide ways and can slide in the slide ways, respectively; the cutting part can slide along the first edge of the first fixing element as the slidable parts slide in the slide ways, respectively.

In an example, the slide way of the first fixing element is arranged between the upper surface and the first edge of the first fixing element, and the slide way of the second fixing element is arranged between the lower surface and the second edge of the second fixing element.

A first attracting element is embedded in the first fixing element; a second attracting element is embedded in the second fixing element, which mutually attract each other. The first attracting element and the second attracting element are fixed together through mutual attraction to allow the lower surface of the second fixing element being pressed against the upper surface of the first fixing element.

BRIEF DESCRIPTION OF THE DRAWINGS

Embodiments of the present disclosure will be described in detail hereinafter in conjunction with accompanying drawings to allow one of ordinary skill in the art to understand the present disclosure more clearly, in which.

DETAILED DESCRIPTION

The technical solutions of the embodiments will be described in a clearly and fully understandable way in conjunction with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present application, are not intended to indicate any sequence. amount or importance, but for distinguishing various components. Also, the terms, such as "a/an," "the," or the like, are not intended to limit the amount, but for indicating the existence of at lease one. Also, the terms, such as "comprise/comprising," "include/including," or the like are intended to specify that the elements or the objects stated before these terms encompass the elements or the objects and equivalents thereof listed after these terms, but not preclude other elements or objects. The terms, "on," "under," "in," "outside," or the like are only used to indicate relative position relationship, and when the position of the object which is described is changed, the relative position relationship may be changed accordingly.

Figure 1:
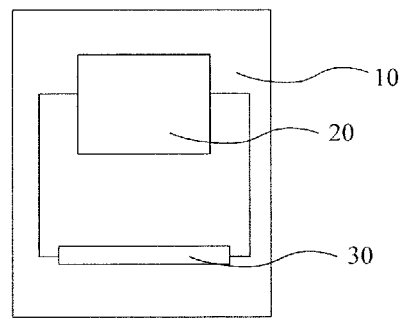
FIG. 1 is a schematic diagram of a flexible circuit board used to perform a test.

The inventors have noticed that, as shown in FIG. 1, a flexible circuit board used to perform a test includes a board body 10, a testing circuit 20 located on a surface of the board body and a testing terminal 30 electrically connected to the testing circuit 20. The testing terminal 30 of the flexible circuit board used to perform a test is pressed on a terminal part of an semi-finished product during electric testing, and the testing terminal is usually pressed fit many times. After being used for a period of time, the testing terminal would be damaged and the whole flexible circuit board cannot be used any more. Therefore, such a flexible circuit board has a short service life and the testing cost is high.

Figure 2:
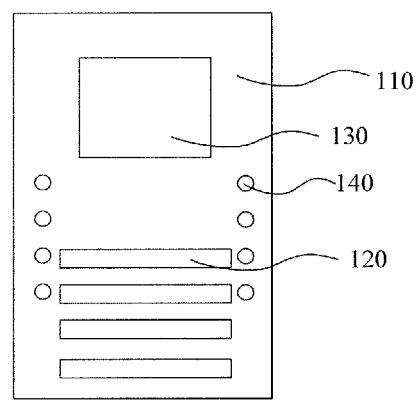
FIG. 2 is a schematic diagram of a flexible circuit board according to an embodiment of the present disclosure.

An embodiment of the present disclosure provides a flexible circuit board. As shown in FIG. 2, the flexible circuit board includes a board body 110 having a cutting region; a plurality of rows of testing terminals 120 located on a surface of the board body. The testing terminal 120 is in a shape of rectangle. A first spacing is provided between two adjacent testing terminals, and the testing terminals can be respectively cut off from the board body along a cutting direction which is along the extending direction of the first spacing in the board body, that is, the cutting direction is parallel to the length direction of the testing terminals. A testing circuit 130 is located on the surface of the board body, and the testing circuit 130 is arranged in a region outside the cutting region. For example, as shown in FIG. 2, the testing circuit 130 and the plurality of testing terminals 120 are offset from each other in the cutting direction. For example, the testing circuit 130 is right above the plurality rows of testing terminals, and the testing circuit 130 is independently and electrically connected to each of the testing terminals 120.

It is noted that, it is an illustrative example that the testing circuit is right above the plurality rows of testing terminals, and the present disclosure is not limited thereto. So long as the testing circuit and the plurality of testing terminals are offset from each other in the cutting direction, the testing circuit may be located on the upper left or the upper right of the plurality rows of testing terminals.

An embodiment of the present disclosure provides a cutting device for cutting the flexible circuit board. The cutting device includes a fixing or locking component configured to fix or lock the flexible circuit board and expose the first spacing as well as its extending region on the board body; and a cutter used to cut the testing terminals from the flexible circuit board along the first spacing and its extending region on the board body.

For the convenience of description, as shown in FIG. 2, based on distances between each of the testing terminals 120 and the testing circuit 130, the plurality rows of testing terminals 120 are respectively a first row of testing terminals, a second row of testing terminals, . . . , a $n^{th}$ row of testing terminals from far to near, where n is a natural number being equal or larger than 2.

During the flexible circuit board being used to perform a test, the first row of testing terminals is firstly used to perform the test, and then the first row of testing terminals is cut off from the flexible circuit board after the first testing terminal is damaged.

Using the cutting device to cut off the damaged first row of testing terminals from the flexible circuit board includes following steps.

The flexible circuit board is fixed or locked through the fixing component or locking component to allow the first spacing between the first row of testing terminals and the second row of testing terminals and its extending region on the board body are exposed.

The first row of testing terminals is cut off from the flexible circuit board along the first spacing and its extending region on the board body by using the cutter.

The second testing terminal can be used to perform a test after the first testing terminal is cut out. In turn, the plurality rows of testing terminals may be used and cut out, respectively.

The flexible circuit board of the embodiment includes a plurality rows of testing terminals located in a cutting region and a testing circuit. A first spacing is provided between two adjacent rows of testing terminals, and the testing terminals can be respectively cut off from the board body along a cutting direction which is along the extending direction of the first spacing in the board body. The testing circuit is arranged in a region outside the cutting region, and the testing circuit is independently and electrically connected to each row of testing terminals. In this way, the plurality rows of testing terminals can be cut off respectively. By connecting the testing circuit independently and electrically to each row of testing terminals, the electrical connection between other rows of testing terminals and the testing circuit of the flexible circuit board are not affected when one row of testing terminals is cut out, and the test to the flexible circuit board can be done continuously.

The cutting device of the embodiment includes a fixing component or locking component and a cutter. The fixing component or locking component is configured to fix or lock the flexible circuit board and expose the first spacing as well as its extending region on the board body; and the cutter is used to conveniently cut the flexible circuit board along the exposed first spacing and its extending region on the board body.

For fixing or locking the flexible circuit board with the fixing (locking) component of the cutting device, for example, as shown in FIG. 2, multiple lines of via holes are formed in the board body, and each line of via holes corresponds to each row of testing terminals 120 of the flexible circuit board, and each line of via holes includes two via holes 140 respectively located at two sides of the testing terminal row. The distance between two via holes 140 in each line is equal.

Figure 3:
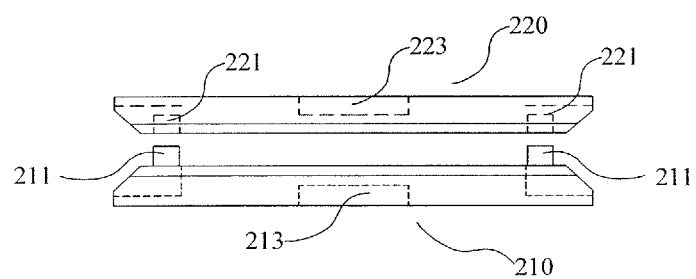
FIG. 3 is a schematic view of a fixing component of a cutting device according to an embodiment of the present disclosure.
Figure 4:
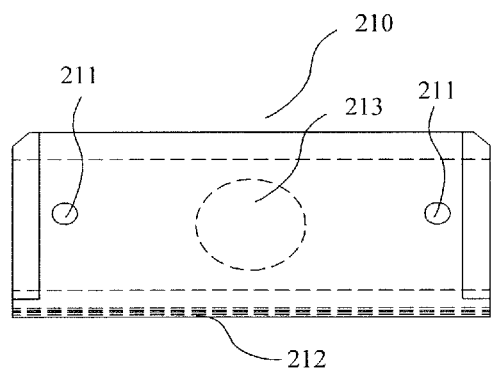
FIG. 4 is a schematic view of a first fixing element of the fixing component shown in FIG. 3.

Correspondingly, as shown in FIGS. 3 and 4, the fixing (locking) component of the cutting device includes a first fixing element 210 and two locating pins 211 disposed on an upper surface of the first fixing element 210. A distance between the two locating pins 211 is equal to the distance between two via holes 140 in each line of via holes in the flexible circuit board. The locating pins 211 pass through the two via holes 140 in each line of via holes in the flexible circuit board to fix or lock the flexible circuit board.

In this way, the locating pins of the first fixing element of the cutting device may respectively pass through the two via holes in each line of via holes in the flexible circuit board to fix or lock the flexible circuit board with the first fixing element of the cutting device.

To expose the first spacing and its extending region on the board body of the flexible circuit board, for example, as shown in FIG. 2, the first spacing between each of two adjacent rows of testing terminals of the flexible circuit board is equal, and the second spacing between each of the two adjacent lines of via holes is equal. The via holes in each line are offset from the corresponding testing terminals toward the testing circuit. Based on the distances between the testing terminals and the testing circuit, the plurality rows of testing terminals are respectively a first row of testing terminals, a second row of testing terminals, . . . , a $n^{th}$ row of testing terminals from far to near, and the corresponding n lines of via holes are respectively a first line of via holes, a second line of via holes, . . . , a $n^{th}$ line of via holes.

Correspondingly, as shown in FIGS. 3 and 4, an upper surface of the first fixing element of the cutting device includes a first edge 212 along the cutting direction. When the $X^{th}$ testing terminal needs to be cut out, the $x^{th}$ line of via holes are fixed or locked with the locating pins, and the first edge 212 of the first fixing element is located at the first spacing between the $x^{th}$ row of testing terminals and the $X+1^{th}$ row of testing terminals.

n is a natural number equal or larger than 2, and X is a natural number falling within a range of 1~n−1.

In this way, when the first testing terminal needs to be cut off from the flexible circuit board due to the first testing terminal being damaged, the first line of via holes are fixed with the locating pins, and the first edge 212 of the fixing element is located at the first spacing between the first row of testing terminals and the second row of testing terminals; the first row of testing terminals is cut off from the flexible circuit board by using the cutter, along the first edge of the first fixing element.

Figure 5:
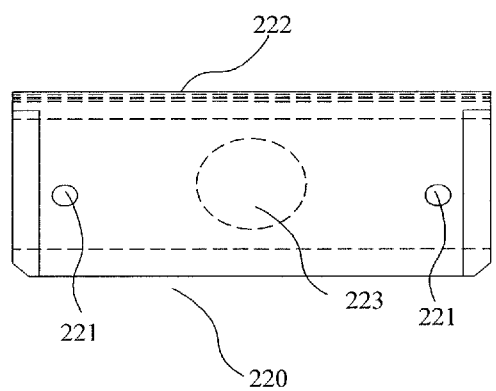
FIG. 5 is a schematic view of a second fixing element of the fixing component shown in FIG. 3.

For fixing the flexible circuit board with the fixing component better, for example, as shown in FIGS. 3 and 5, the fixing component further includes a second fixing (locking) element 220. The second fixing element has two locating holes 221 in its lower surface. A distance between the two locating holes 221 is equal to the distance between the two locating pins 211. The locating pins 211 are inserted into the locating holes 221 to allow the lower surface of the second fixing element is pressed against the upper surface of the first fixing element and the first edge 212 of the first fixing element is aligned with a second edge 222 of the second fixing element.

In this way, the locating pins of the first fixing element are inserted into the locating holes of the second fixing element, and the first fixing element is pressed against the second fixing element, to allow the flexible circuit board being fixed better; and the first edge of the first fixing element is aligned with the second edge of the second fixing element located on the first fixing element. The testing terminals may be cut off from the flexible circuit board by using the cutter, along the first edge of the first fixing element and the second edge of the second fixing element located on the first fixing element.

For example, for fixing the flexible circuit board with the first fixing element and the second fixing element better, as shown in FIGS. 2, 3 and 4, a first attracting element 213 is embedded in the first fixing element. Correspondingly, as shown in FIG. 5, a second attracting element 223 is embedded in the second fixing element, to allow it attracting the first attracting element 213. The first attracting element and the second attracting element are fixed together through mutual attraction to allow the lower surface of the second fixing element being pressed against the upper surface of the first fixing element.

In this way, when the flexible circuit board is fixed with the locating pins of the first fixing element, the first attracting element and the second attracting element attract each other to allow the second fixing element being pressed against the flexible circuit board. The flexible circuit board is placed on the upper surface of the first fixing element, to allow the flexible circuit board being fixed or fastened strongly.

As an exemplary implementation, the first attracting element and the second attracting element are magnets.

Figure 6:
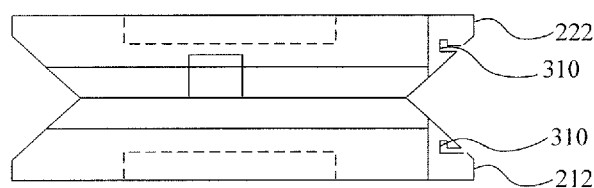
FIG. 6 is another schematic view of a fixing component of a cutting device according to an embodiment of the present disclosure.
Figure 7:
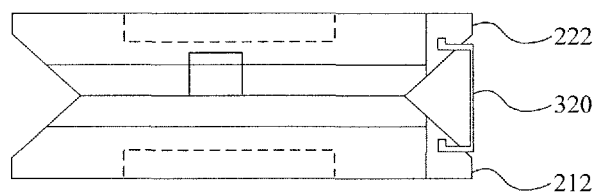
FIG. 7 is a schematic diagram of a cutting device according to an embodiment of the present disclosure.

A connection between the cutter and the fixing component may directly affect whether the testing terminal can be conveniently cut out. For example, as shown in FIGS. 6 and 7, each of the first fixing element and the second fixing element has a slide way 310. The direction of the slide way 310 is parallel to the cutting direction.

The cutter 320 has a cutting part and two slidable parts connected with the cutting part. The slidable parts may slip in the slide ways and may slide in the slide ways, respectively. The cutting part may slide along the first edge of the first fixing element as the slidable parts slide in the slide ways, respectively.

In this way, when the flexible circuit board is fixed between the first fixing element and the second fixing element, the cutting part may slide along the first edge of the first fixing element as the slidable parts slide in the slide ways along the cutting direction, respectively, and the cutting part can cut the flexible circuit board along the first spacing and its extending region on the flexible circuit board exposed at the first edge.

For example, as shown in FIGS. 6 and 7, the slide way 310 of the first fixing element is arranged between the upper surface and the first edge 212 of the first fixing element, and the slide way 310 of the second fixing element is arranged between the lower surface and the second edge 222 of the second fixing element.

The embodiments of the present disclosure provide a flexible circuit board and a cutting device. The flexible circuit board includes a board body having a cutting region; a plurality rows of testing terminals located in the cutting region, a first spacing being provided between two adjacent rows of testing terminals. The testing terminals can be respectively cut off from the board body along a cutting direction which is along the extending direction of the first spacing in the board body. A testing circuit is located on a surface of the board body, the testing circuit being arranged in a region outside the cutting region and the testing circuit is independently and electrically connected to each row of testing terminals. In this way, the plurality of testing terminals may be cut off from the flexible circuit board, respectively. The cutting device of the present disclosure includes a fixing component and a cutter. The fixing component is configured to fix the flexible circuit board and expose the first spacing and its extending region on the board body; and the cutter is configured to cut the testing terminal row from the flexible circuit board along the first spacing and its extending region on the board body.

The described above are only illustrative implementations of the present disclosure. For one of ordinary skill in the art, various modifications and improvements may be made without departing from the spirit and scope of embodiments of the present disclosure, and all of which shall fall within the scope of the present disclosure.

The present application claims priority of Chinese patent application No. 201510604153.1 filed on Sep. 21, 2015 and entitled "FLEXIBLE CIRCUIT BOARD AND CUTTING DEVICE", the entire contents of which are incorporated herein by reference.

What is claimed is:

1. A flexible circuit board, comprising:
    a board body including a cutting region;
    a plurality rows of testing terminals located in the cutting region, wherein a first spacing is provided between two adjacent rows of testing terminals, and each row of the testing terminals can be respectively cut off from the board body along a cutting direction which is along the extending direction of the first spacing in the board body;
    multiple lines of via holes, wherein each line of the via holes corresponds to each row of the testing terminals, and each line of the via holes includes two via holes respectively located at two sides of the corresponding testing terminal row; and
    a testing circuit located on a surface of the board body, wherein the testing circuit is arranged in a region outside the cutting region and the testing circuit is independently and electrically connected to each row of the testing terminals;
    wherein the via holes in each line are offset from the corresponding testing terminal toward the testing circuit.

2. The flexible circuit board according to claim 1, wherein each of the testing terminals is in a shape of rectangle, and the cutting direction is parallel to the length direction of the testing terminal row.

3. The flexible circuit board according to claim 2, wherein a gap is provided between each via hole and a corresponding end of the corresponding testing terminal row, and the distance between two via holes in each line is equal to each other.

4. The flexible circuit board according to claim 3, wherein the first spacing between each of two adjacent rows of testing terminals is equal to each other, and a second spacing between each of two adjacent lines of via holes is equal to each other.

5. A cutting device for cutting the flexible circuit board according to claim 1, comprising:
    a fixing component configured to fix the flexible circuit board and expose the first spacing and its extending region on the board body; and
    a cutter configured to cut the testing terminals from the flexible circuit board along the first spacing and its extending region on the board body.

6. The cutting device according to claim 5, wherein each of the testing terminals is in a shape of rectangle, and the cutting direction is parallel to the length direction of the testing terminal row.

7. The cutting device according to claim 6, wherein the distance between two via holes in each line is equal.

8. The cutting device according to claim 7, wherein the fixing component of the cutting device comprises a first fixing element and two locating pins disposed on an upper surface of the first fixing element, and a distance between the two locating pins is equal to the distance between two via holes in each line of the flexible circuit board, and the locating pins are configured to pass through the two via holes in each line of the flexible circuit board to fix the flexible circuit board.

9. The cutting device according to claim 8, wherein the first spacing between each of two adjacent rows of the testing terminals of the flexible circuit board is equal to each other, and the second spacing between each of two adjacent lines of the via holes is equal; the via holes in each line are offset from the corresponding testing terminals toward the testing circuit; based on a distance between each of the testing terminals and the testing circuit, the plurality rows of testing terminals are respectively a first row of testing terminals, a second row of testing terminals, . . . , a $n^{th}$ row of testing terminals from far to near, and the corresponding n lines of via holes are respectively a first line of via holes, a second line of via holes, . . . , a $n^{th}$ line of via holes; and
    an upper surface of the first fixing element of the cutting device includes a first edge along the cutting direction; if the $X^{th}$ testing terminal needs to be cut out, the $x^{th}$ line of via holes are fixed with the locating pins, and the first edge of 1 the first fixing element is located at the first spacing between the $x^{th}$ testing terminal and the $X+1^{th}$ testing terminal;
    where n is a natural number being equal or larger than 2; and X is a natural number falling within a range of 1~n−1.

10. The cutting device according to claim 9, wherein the fixing component further comprises a second fixing element; wherein the second fixing element has two locating holes in its lower surface; a distance between the two locating holes is equal to the distance between the two locating pins; the locating pins are configured to be inserted into the locating holes to allow the lower surface of the second fixing element being pressed against the upper surface of the first fixing element and the first edge of the first fixing element is aligned with a second edge of the second fixing element.

11. The cutting device according to claim 10, wherein the first fixing element is configured with a first attracting element; the second fixing element is configured with a second attracting element which mutually attracts the first attracting element; the first attracting element and the second attracting element are fixed together through mutual attraction to allow the lower surface of the second fixing element is pressed against the upper surface of the first fixing element.

12. The cutting device according to claim 10, wherein a first attracting element is embedded in the first fixing element; a second attracting element is embedded in the second fixing element, which mutually attracts each other; the first attracting element and the second attracting element are fixed together through mutual attraction to allow the lower surface of the second fixing element being pressed against the upper surface of the first fixing element.

13. The cutting device according to claim 11, wherein the first fixing element and the second fixing element each has a slide way; and the direction of the slide ways is parallel to the cutting direction; and
   the cutter has a cutting part and two slidable parts connected with the cutting part, and the slidable parts can slip in the slide ways and can slide in the slide ways, respectively; the cutting part can slide along the first edge of the first fixing element as the slidable parts slide in the slide ways, respectively.

14. The cutting device according to claim 13, wherein the slide way of the first fixing element is arranged between the upper surface and the first edge of the first fixing element, and the slide way of the second fixing element is arranged between the lower surface and the second edge of the second fixing element.

* * * * *